(12) United States Patent
Baiocchi et al.

(10) Patent No.: US 7,041,561 B2
(45) Date of Patent: May 9, 2006

(54) ENHANCED SUBSTRATE CONTACT FOR A SEMICONDUCTOR DEVICE

(75) Inventors: Frank A. Baiocchi, Allentown, PA (US); Bailey R. Jones, Mohnton, PA (US); Muhammed Ayman Shibib, Wyomissing, PA (US); Shuming Xu, Schnecksville, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/814,062

(22) Filed: Mar. 31, 2004

(65) Prior Publication Data

US 2005/0221563 A1    Oct. 6, 2005

(51) Int. Cl.
*H01L 21/336* (2006.01)

(52) U.S. Cl. ...................... 438/270; 438/589
(58) Field of Classification Search ........... 438/268, 438/269, 270, 271, 589
See application file for complete search history.

(56) References Cited

U.S. PATENT DOCUMENTS 5,981,344 A * 11/1999 Hshieh et al. ............. 438/270
6,084,264 A * 7/2000 Darwish ..................... 257/329
2002/0053699 A1* 5/2002 Kim et al. .................. 257/343

OTHER PUBLICATIONS

C.S. Kim et al., "Trenched-Sinker LDMOSFET (TS-LDMOS) Structure for 2 GHz Power Amplifiers," ETRI Journal, vol. 25, No. 3, pp. 195-202, Jun. 2003.

* cited by examiner

Primary Examiner—Chandra Chaudhari

(57) ABSTRACT

A technique for forming a semiconductor structure in a semiconductor wafer includes the steps of forming an epitaxial layer on a least a portion of a semiconductor substrate of a first conductivity type and forming at least one trench in an upper surface of the semiconductor wafer and partially into the epitaxial layer. The method further includes the step of forming at least one diffusion region between a bottom wall of the trench and the substrate, the diffusion region providing an electrical path between the bottom wall of the trench and the substrate. One or more sidewalls of the trench are doped with a first impurity of a known concentration level so as to form an electrical path between an upper surface of the epitaxial layer and the at least one diffusion region. The trench is then filled with a filler material.

19 Claims, 4 Drawing Sheets

ENHANCED SUBSTRATE CONTACT FOR A SEMICONDUCTOR DEVICE

FIELD OF THE INVENTION

The present invention relates generally to semiconductor devices, and more particularly relates to techniques for forming a substrate contact for use in a semiconductor device.

BACKGROUND OF THE INVENTION

Power metal-oxide-semiconductors (MOS) devices, including lateral diffused MOS (LDMOS) devices, are employed in a variety of applications, such as, for example, power amplifiers in wireless communications systems. Radio frequency (RF) LDMOS devices are generally fabricated on a semiconductor wafer comprising a substrate that is typically formed of single crystal silicon which has been heavily doped with an impurity, such as, for example, boron, so as to form a low-resistivity substrate (e.g., about $10^{18}$ to about $10^{19}$ atoms per cubic centimeter). A lightly-doped epitaxial layer (e.g., about $10^{14}$ to about $10^{15}$ atoms per cubic centimeter), typically about ten microns thick, is generally formed on the substrate.

One problem in fabricating an LDMOS device is forming a substrate contact for providing a low-resistance electrical path from an active region in the device formed near an upper surface of the wafer, through the lightly-doped epitaxial layer to the more heavily-doped substrate below. Previous attempts to solve this problem have involved forming a diffused sinker by doping the surface of the silicon with a heavy boron predeposition or implanting a relatively high-dose ion implant, either of which is then thermally driven at a high temperature (e.g., in excess of 1000 degrees Celsius) for a relatively long duration (e.g., typically in excess of about 10 hours) through the epitaxial layer until it merges with the heavily doped substrate below. In driving the diffusion or implant down into the silicon, however, the dopant will out-diffuse on either side by a certain amount, typically about 8 microns. Thus, the formation of the diffused sinker consumes a substantially large area in the wafer comparable to the needed depth of the sinker. This condition significantly reduces packing density in the wafer. The requirement of a high-dose implant step can also result in excessive implant time for the wafer.

The long period of time required for the high temperature drive-in process can undesirably result in a large up-diffusion of dopant from the heavily-doped substrate into the lightly-doped epitaxial layer which effectively thins the epitaxial layer, thereby lowering junction breakdown voltage and increasing junction leakage. Additionally, an increase in the number of misfit dislocations can occur, generally originating from mismatches between the lattices of the epitaxial layer and substrate. This often leads to a drop in yield and/or reliability, among other disadvantages.

Other known attempts at forming a substrate contact for providing a low-resistance path between the upper surface of the wafer and the substrate have involved forming one or more conductive plugs through the epitaxial layer down to the substrate. This methodology involves first forming v-grooves (e.g., by a wet etching process), or other trenches (e.g., by a dry etching process), entirely through the epitaxial layer to expose the substrate, and depositing a conductive material, such as, for example, tungsten, metal or silicide, in the v-grooves, thereby establishing an electrical connection with the substrate.

FIGS. 1A and 1B are cross-sectional views of at least a portion of a semiconductor wafer 100 illustrating processing steps which may be used in forming conventional substrate contacts. With reference to FIG. 1A, the wafer 100 may include a substrate 102, which is typically formed of silicon that is heavily doped with an impurity (e.g., boron, phosphorous, etc.) of a desired concentration. The wafer 100 may include an epitaxial layer 104 formed on at least a portion of the substrate 102. An insulating layer 106 (e.g., silicon dioxide) may be formed on at least a portion of the epitaxial layer 104. Deep trenches 108 may be formed through the insulating layer 106 and epitaxial layer 104, to at least partially expose the substrate 102. As shown in FIG. 1B, the trenches 108 are then filled with an electrically conductive material 110 (e.g., aluminum) to form conductive plugs entirely through the epitaxial layer 104. Each of the conductive plugs provide a substantially low-resistance (e.g., about 8 to 10 ohms) path between the upper surface of the wafer 100 and the substrate 102.

A primary disadvantage of the above approach, however, is the inability to control a surface doping in the substrate and in a source region of the LDMOS device so as to produce acceptable contact resistance between the substrate/source region and deposited conductive layer. Another disadvantage with this approach is the need to precisely control the fill of the v-grooves so as to ensure a substantially planar surface, which is essential for further processing, and a substantially void-free fill, typically a requirement in forming a sufficiently low-resistance contact. Furthermore, the depth of the v-grooves requires a certain minimum width because a substantially constant aspect ratio of depth-to-width (e.g., about 5-to-1) generally should be maintained during processing of the wafer.

There exists a need, therefore, for an enhanced substrate contact capable of improved performance and reliability that does not suffer from one or more of the above-noted deficiencies typically affecting conventional substrate contacts. Furthermore, it would be desirable if such a substrate contact was fully compatible with a conventional semiconductor process technology.

SUMMARY OF THE INVENTION

The present invention provides techniques for forming an improved low-resistance (e.g., less than about 10 ohms per square) substrate contact for use, for instance, in an MOS device. The improved substrate contact may be formed, in accordance with an illustrative embodiment of the invention, by etching one or more trenches partially into an epitaxial layer of a semiconductor wafer, forming low-resistivity diffusion regions between bottom walls of the trenches and substrate, and heavily doping the sidewalls of the trenches with an impurity predeposition, such as, for example, using boron, phosphorous or arsenic. In this manner, a low-resistance path can be formed between an upper surface of the semiconductor wafer and the substrate, without the need for an extensive high-temperature drive-in process, without relying on filling the trenches with a conductive material (e.g., metal, silicide, etc.) having a significant contact resistance associated therewith. Moreover, since the depth of the trenches is significantly less compared to, for example, a traditional conductive plug, the required width of the trenches at the upper surface of the wafer is beneficially reduced, thereby increasing a packing density in the wafer.

In accordance with one aspect of the invention, a method for forming a semiconductor structure in a semiconductor wafer includes the steps of forming an epitaxial layer on a least a portion of a semiconductor substrate of a first conductivity type and forming at least one trench in an upper surface of the semiconductor wafer and partially into the epitaxial layer. The method further includes the step of forming at least one diffusion region between a bottom wall of the trench and the substrate, the diffusion region providing an electrical path between the bottom wall of the trench and the substrate. One or more sidewalls of the trench are doped with a first impurity of a known concentration level so as to form an electrical path between an upper surface of the epitaxial layer and the at least one diffusion region. The trench is then filled with a filler material.

In accordance with another aspect of the invention, a semiconductor structure includes a substrate of a first conductivity type, an epitaxial layer formed on at least a portion of the substrate, and at least one trench formed partially into the epitaxial layer. At least one diffusion region is formed in the epitaxial layer between a bottom wall of the trench and the substrate. The trench and diffusion region together provide a substantially low-resistance electrical path between an upper surface of the epitaxial layer and the substrate. The trench is formed by: (i) forming at least one opening partially into the epitaxial layer, the opening corresponding to the trench; (ii) doping at least one or more sidewalls of the opening with a first impurity; and (iii) substantially filling the opening with a filler material.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of an illustrative MOS integrated circuit fabrication technology suitable for forming discrete RF LDMOS transistors, as well as other devices and/or circuits. It should be appreciated, however, that the present invention is not limited to the fabrication of this or any particular device or circuit. Rather, the invention is more generally applicable to techniques for forming a semiconductor structure capable of providing a low-resistance electrical connection between an upper surface of an epitaxial layer and a substrate associated with a semiconductor wafer. Moreover, although implementations of the present invention are described herein with specific reference to an LDMOS device and a complementary metal-oxide-semiconductor (CMOS) fabrication process, it is to be appreciated that the techniques of the present invention are similarly applicable to other fabrication processes (e.g., bipolar) and/or the formation of other devices, such as, but not limited to, an MOS field-effect transistor (MOSFET), a bipolar junction transistor (BJT), a vertical diffused MOS (DMOS) device, an extended drain MOSFET device, etc., with or without modifications thereto, as will be understood by those skilled in the art. Other semiconductor devices, such as, but not limited to, monolithic capacitors and resistors, may also benefit from the techniques of the present invention set forth herein.

FIGS. 2–6 depict steps in an exemplary methodology which may be used in forming an improved substrate connection which may be used, for example, in an MOS device, in accordance with an illustrative embodiment of the present invention. The exemplary methodology will be described in the context of a conventional CMOS-compatible semiconductor fabrication process technology. It is to be appreciated, however, that the invention is not limited to this or any particular methodology for fabricating the device. Moreover, it is to be understood that the various layers and/or regions shown in the accompanying figures may not be drawn to scale, and that one or more semiconductor layers of a type commonly used in such integrated circuit structures may not be explicitly shown in a given figure for ease of explanation. This does not imply that the semiconductor layer(s) not explicitly shown are omitted in the actual integrated circuit structure.

Figure 1A:
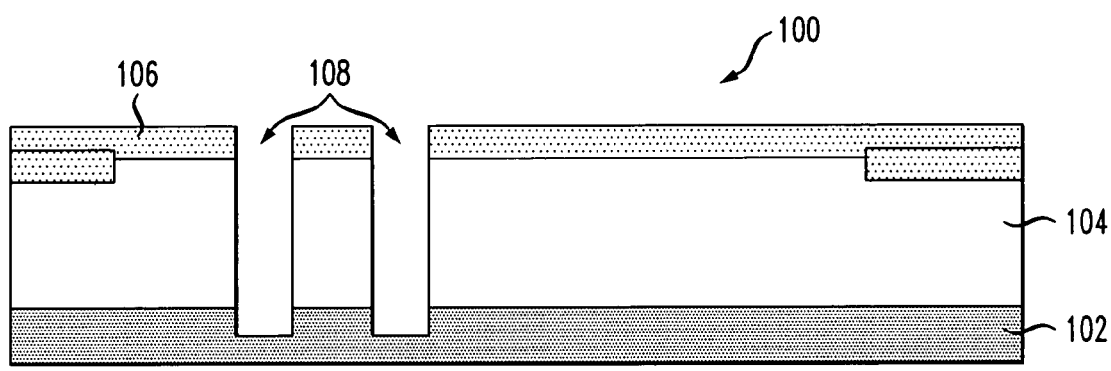
FIGS. 1A and 1B are cross-sectional views of at least a portion of a semiconductor wafer illustrating processing steps which may be used in forming conventional substrate contacts.
Figure 1B:
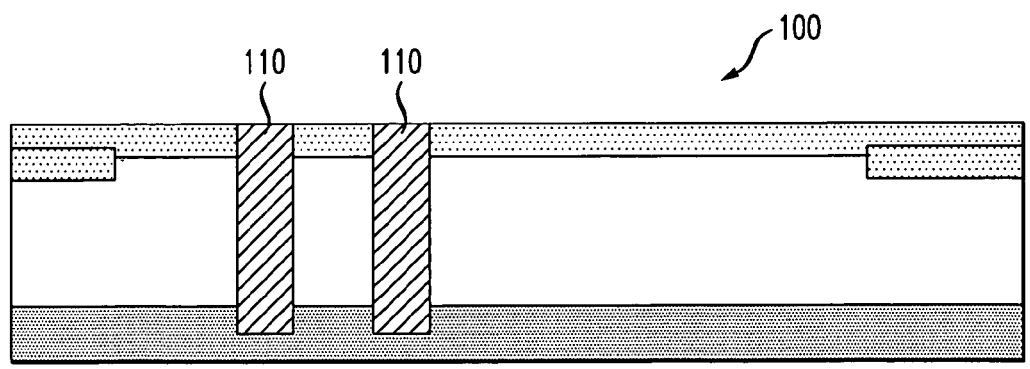
Figure 2:
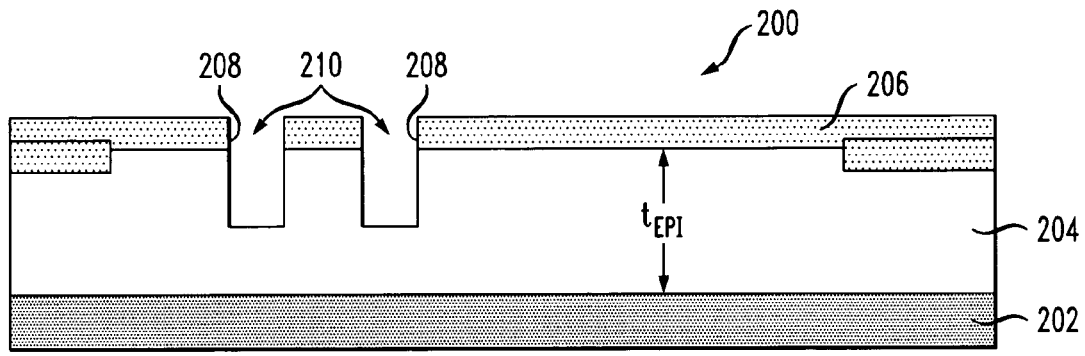
FIGS. 2–6 are cross-sectional views depicting steps in a semiconductor fabrication process which may be used in forming an exemplary substrate contact, in accordance with an illustrative embodiment of the present invention.

FIG. 2 illustrates a cross-sectional view of at least a portion of a semiconductor wafer 200. The wafer 200 includes a substrate 202, which is commonly formed of single-crystal silicon (e.g., having a <100> or <111> crystal orientation), although alternative materials may be used, such as, but not limited to, germanium (Ge), gallium arsenide (GaAs), etc. Additionally, the substrate may have been modified by adding an impurity or dopant to change the conductivity of the material (e.g., n-type or p-type). In a preferred embodiment of the invention, the substrate 202 is of p-type conductivity and may thus be referred to as a p+ substrate. A p+ substrate may be formed, for example, by adding a p-type impurity or dopant (e.g., boron) of a desired concentration (e.g., about $5 \times 10^{18}$ to about $5 \times 10^{19}$ atoms per cubic centimeter) to the substrate material as it is grown, or by a diffusion or implant step after the substrate is grown, to change the conductivity of the material as desired.

The wafer 200 may include an epitaxial layer 204 formed on at least a portion of the substrate 202. The epitaxial layer 204 is preferably grown over the entire surface of the wafer 200, such as, for example, by using a conventional epitaxy process. Epitaxy is a well-known deposition technique during which additional silicon atoms can be deposited on a single-crystal silicon substrate, without changing the crystalline structure of the silicon wafer. During the epitaxial deposition, the single-crystal silicon substrate 202 can be extended by, for example, a vapor deposition of additional atomic layers of silicon. By controlling the deposition rates, and introducing selected types of impurities (e.g., boron, phosphorous, arsenic, etc.) into the carrier gases, the thickness and resistivity of the epitaxial layer 204 can be precisely controlled as desired. The thickness, $t_{EPI}$, of the epitaxial layer 204 is typically about 6 to 9 microns. In a preferred embodiment of the invention, the epitaxial layer 204 is lightly doped compared to the substrate, e.g., about $5 \times 10^{14}$ to about $10^{15}$ atoms per cubic centimeter, with a p-type impurity (e.g., boron).

The term "semiconductor wafer," or simply "wafer," as may be used herein refers to the substrate 202, with or without an epitaxial layer 204, and preferably includes one or more other layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on which a semiconductor structure may be formed.

At least one insulating layer 206 may be formed on at least a portion of the epitaxial layer 204. The insulating layer 206 preferably comprise an oxide, such as, for example, silicon dioxide ($SiO_2$), and may therefore be referred to as an oxide layer. The insulating layer may comprise alternative materials, such as, but not limited to, silicon nitride (SiN), etc. The insulating layer 206 is preferably grown on the epitaxial layer 204, such as by using an oxidation (e.g., local oxidation) or surface passivation process. Oxidation, or surface passivation, may be achieved by exposing an upper surface of the silicon wafer 200 to an oxidizing agent, such as, but not limited to, oxygen gas, water vapor, etc., at a relatively high temperature (e.g., about 900 to about 1200 degrees Celsius). The insulating layer 206, which may be about 0.5 microns thick for a 0.35-micron CMOS process, provides many benefits during the fabrication of an MOS device, some of which include protecting the wafer from external contamination and serving as a barrier to the diffusion of impurities into the silicon. Thus, by etching well-defined patterns into the insulating layer(s), one can accurately diffuse desired impurities into selected areas of the wafer 200.

As apparent from the figure, one or more openings 208 are preferably formed through the insulating layer 206, to at least partially expose the epitaxial layer 204. The openings 208 may be formed by selectively patterning the insulating layer 206, for example, using a conventional photolithographic process, followed by an etching step. During the photolithographic patterning process, a layer of photoresist (not shown) is first deposited on the upper surface of the wafer 200 to prevent the insulating layer 206 from being removed in a subsequent etching process. The photoresist is then exposed to light (e.g., ultra violet) in a manner which allows the photoresist to be removed in areas of the wafer in which the openings 208 are to be formed. During the etching process, which may comprise, for example, an anisotropic dry etch, the insulating layer 206 is removed down to the epitaxial layer 204. It is to be understood that alternative etching techniques may be similarly employed for forming the openings 208, such as, but not limited to, reactive ion etching (RIE), wet etching, etc. In a preferred embodiment of the invention, the openings 208 are about one to two microns, and more preferably about 1.2 microns, in width and spaced about 5 microns apart relative to one another, for an exemplary 0.35-micron CMOS process.

One or more shallow trenches 210 are formed through the openings 208 in the insulating layer 206. The trenches 210 are preferably formed by first stripping the photoresist (not shown) from the upper surface of the wafer 200, such as by using a wet etching process (e.g., using a mixture of sulfuric acid and hydrogen peroxide), and then etching (e.g., dry etching, RIE, etc.) partially into the epitaxial layer 204, without exposing the substrate. The present invention contemplates that the openings 208 into the epitaxial layer 204 may be formed using alternative methodologies, such as, for example, a conventional v-groove technique. As is known by those skilled in the art, a v-groove may be formed using a wet etching process (e.g., potassium hydroxide (KOH) based etch). A v-groove, as the name implies, is typically characterized by sidewalls that are v-shaped (e.g., sloped), and thus significantly less steep compared to the sidewalls of trenches 210. Because a certain depth-to-width aspect ratio must typically be maintained while forming the v-groove, a width of the v-groove proximate the upper surface of the wafer 200 may be substantially large, which may be undesirable in forming structures where density is a premium. Therefore, while alternative methodologies may be used to form the trenches 210, using a dry etch to form the trenches is preferable.

As previously stated, the trenches 210 are not etched entirely through the epitaxial layer 204 to thereby expose the substrate 202, as is conventionally done. Instead, the trenches 210 are preferably formed about one quarter to about one third of the way through the epitaxial layer 204. Assuming the thickness $t_{EPI}$ of the epitaxial layer 204 to be about 6 to 9 microns, the depth of the trenches 210 in the epitaxial layer 204 is about 1.5 microns to about 3 microns in a preferred embodiment of the invention. By reducing the depth of the trenches 210 in the epitaxial layer 204, the width of the trenches proximate the upper surface of the wafer 200 can be reduced accordingly, thereby increasing a packing density in the wafer 200.

Figure 3:
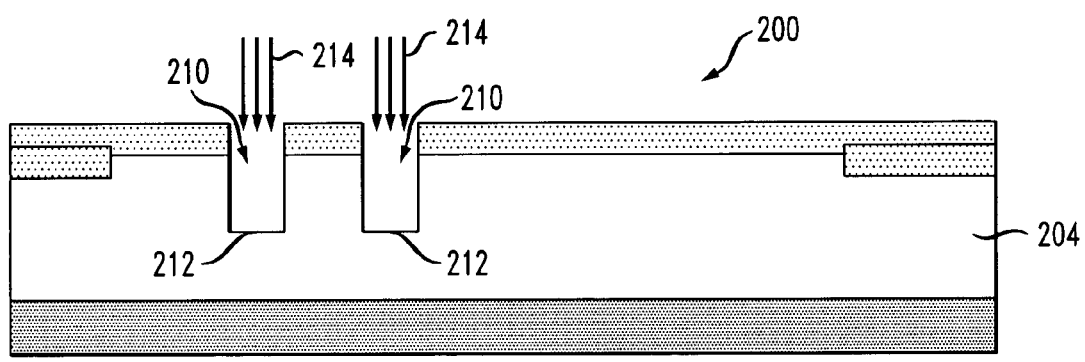

As shown in FIG. 3, after forming the trenches 210 in the epitaxial layer 204, a doping process is used to deposit an impurity proximate a bottom wall 212 of the trenches 210. The doping process preferably comprises a high-energy implant step, wherein a high concentration (e.g., about $5 \times 10^{18}$ to about $5 \times 10^{19}$ atoms per cubic centimeter) of impurity 214 is implanted into the epitaxial layer 204, primarily through the bottom wall 212 of the trenches 210. The impurity 214 used in the implant step may include, but is not limited to, boron, phosphorous, arsenic, etc. In a preferred embodiment of the invention, boron is used as the impurity. The implant energy used during the high-energy implant step is preferably about one million electron-volts (eV). Typically, about 300,000 eV provides an implant depth of about one micron. Therefore, an implant energy of about one million eV would generally be able to implant the impurity about two to three microns into the epitaxial layer, e.g., for boron.

Figure 4:
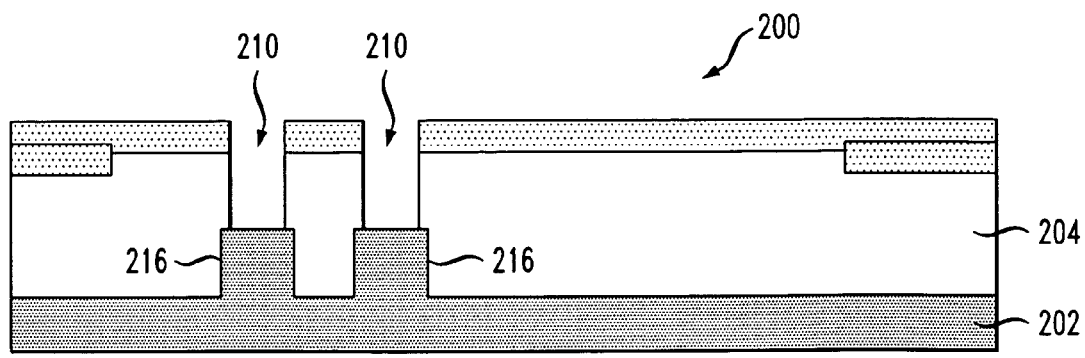

Following the high-energy implant step, the impurity deposited at the bottom walls of the trenches 210 is driven through the epitaxial layer 204 so as to form diffusion regions 216 between the respective bottom walls of the trenches 210 and the substrate 202 to obtain a desired low-resistance path, as shown in FIG. 4. The drive-in process may comprise, for example, heating the wafer 200 to a relatively high temperature, such as greater than about 800 degrees Celsius, for a relatively short duration (e.g., about one hour) in a substantially inert ambient. A two percent oxygen mixture may also be introduced into the ambient during drive-in. Drive-in is generally used to move implanted dopant atoms deeper into the epitaxial layer 204, in a direction of concentration gradient. In this regard, the drive-in process may be similar to a diffusion. The diffusion regions 216 form substantially low-resistance (e.g., less than about one ohm) paths between the substrate 202 and the respective bottom walls of the trenches 210.

Figure 5:
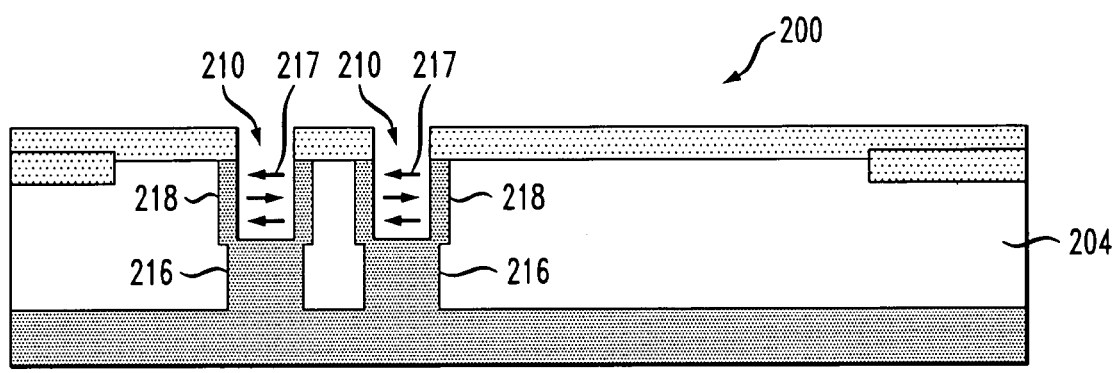

With reference to FIG. 5, at least the sidewalls 218 of the trenches 210 are heavily doped with an impurity 217, such as, but not limited to, boron. In an alternative embodiment of the invention, less than all sidewalls, or a sidewall and bottom wall, of the trenches may be doped. The doping of the trenches 210 may be performed by predepositing the impurity 217 (e.g., boron) on at least one or more sidewalls of the trenches, and then performing a drive-in process for diffusing the impurity 217 deeper into the epitaxial layer 204 proximate the trenches 210 to obtain a desired low-resistance path. The drive-in step may comprise, for example, heating the wafer 200 at a relatively high temperature, such as about 900 to about 1200 degrees Celsius, for a relatively short duration, such as about one hour. The deposition of the impurity 217 can be accomplished, for instance, by growing an impurity-rich oxide on the sidewalls of the trenches 210. Alternatively, the deposition may be accomplished using an implant step, especially where the sidewalls of the trenches are at least slightly sloped (e.g., v-shaped). In a preferred embodiment of the invention, the sidewalls 218 of the trenches 210 may be doped with a boron impurity by exposing the sidewalls to a liquid boron tribromide ($BBr_3$) solution, or alternative dopant source, at a temperature of about 1050 degrees Celsius for a duration of about one hour.

Following the impurity predeposition and drive-in steps, a wet chemical clean-up, or alternative wafer cleaning process, may be performed in order to substantially remove any surface contaminants that may remain in the trenches 210. The clean-up process may comprise, for example, placing the wafer 200 in a 1:1 solution of hydrogen peroxide and sulphuric acid for about 15 minutes. The wafer 200 may also be dipped in a dilute solution of hydrofluoric acid (HF) to strip away any oxide in the trenches, exposing the silicon in the epitaxial layer 204 proximate the sidewalls 218 of the trenches 210.

Figure 6:
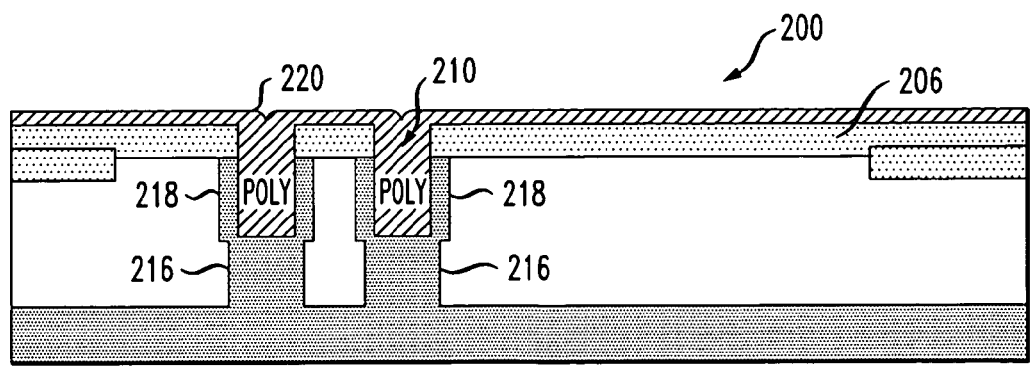

FIG. 6 illustrates an exemplary trench fill process. After the clean-up step (when performed), the trenches 210 are preferably filled with a filler material 220, such as, for instance, polycrystalline silicon, often referred to as polysilicon or simply poly. The polysilicon can be deposited using, for example, a low-pressure chemical vapor deposition (LPCVD) process, although alternative deposition techniques may also be employed, as will be known by those skilled in the art. The filler material 220 primarily provides planarization and structural support for the trenches 210 and thus need not have a substantially low resistivity associated therewith.

Unlike a traditional conductive plug, which relies almost entirely on the filler material being of low resistivity in order to provide the low-resistance electrical path between the upper surface of the wafer and the substrate, the substrate contact of the present invention relies primarily on the doped sidewalls 218 of the trenches 210 and the diffusion regions 216 to provide the low-resistance electrical path. However, use of a filler material having a low resistivity (e.g., chemical vapor deposited (CVD) tungsten, silicide, doped polysilicon, etc.) may even further lower the resistance of the substrate contact. In a preferred embodiment of the invention, doped polysilicon is used as the filler material 220. Since polysilicon characteristically behaves in a manner similar to silicon, the use of polysilicon as a filler material for the trenches provides a more homogeneous upper surface of the wafer 200, thereby making it easier to form active devices in the upper surface of the wafer, and is therefore preferred.

Although not shown, a wafer planarization step may subsequently be performed, wherein the upper surface of the wafer 200 is made substantially planar. To accomplish this, an upper surface of the filler material 220 is removed down to the insulating layer 206 using a process, such as, but not limited to, chemical-mechanical polishing (CMP), plasma etch-back, grinding, etc., although alternative means (e.g., wet etching, etc.) are similarly contemplated by the invention. The insulating layer 206 is preferably used as a stop so that the epitaxial layer 204 is not damaged during the planarization process. Once the upper surface of the wafer 200 has been made substantially planar, the insulating layer 206 is preferably removed, such as by etching, and a thin oxide layer and a silicon nitride layer (not shown) may be formed on the upper surface of the wafer 200. The thin oxide layer and silicon nitride layer may be used in a subsequent gate and source and drain (GASAD) process in which a gate and source and drain regions are formed in the wafer 200, as used to fabricate MOS devices in a conventional manner.

As previously explained, in forming a conventional substrate contact comprising a diffused sinker, in order to distribute the impurity, which is typically diffused or implanted near the upper surface of the wafer, through the epitaxial layer and down to the substrate, an extensive high-temperature drive-in process is necessary. The duration of time required for drive-in is generally proportional to the thickness of the epitaxial layer, since the rate of diffusion of the impurity is relatively constant for a given temperature and impurity type. In forming a conventional diffused sinker, the duration of time required for drive-in is typically greater than about ten hours.

Etching deep trenches entirely through the epitaxial layer to expose the substrate, as is required for forming a substrate contact comprising a conventional conductive plug, may eliminate the long duration high-temperature drive-in process. However, the deep trenches require a certain minimum width at the upper surface of the wafer as a result of the inherent depth-to-width aspect ratio associated with the trench formation process, as previously explained. This undesirably results in a reduced packing density in the wafer, as compared to alternative methodologies.

Forming trenches 210 partially into the epitaxial layer 204, in accordance with the invention, significantly shortens the duration of the high-temperature drive-in process, as compared to the duration of the drive-in required for forming a diffused sinker. The shorter drive-in period of the present invention beneficially decreases the likelihood that misfit dislocations from the epitaxial layer/substrate interface will diffuse to the surface of the epitaxial layer, thereby reducing device electrical leakage and reliability problems. Additionally, since the trenches 210 are not formed as deep into the epitaxial layer as compared to a standard conductive plug, the respective widths of the trenches proximate the upper surface of the wafer 200 are beneficially reduced, thereby providing an increased packing density in the wafer compared to using conductive plugs. Thus, an important advantage of the techniques of the present invention is that it combines the benefits of a diffused sinker and a conductive plug to form a substantially low-resistance connection between the substrate and the upper surface of the wafer.

Figure 7:
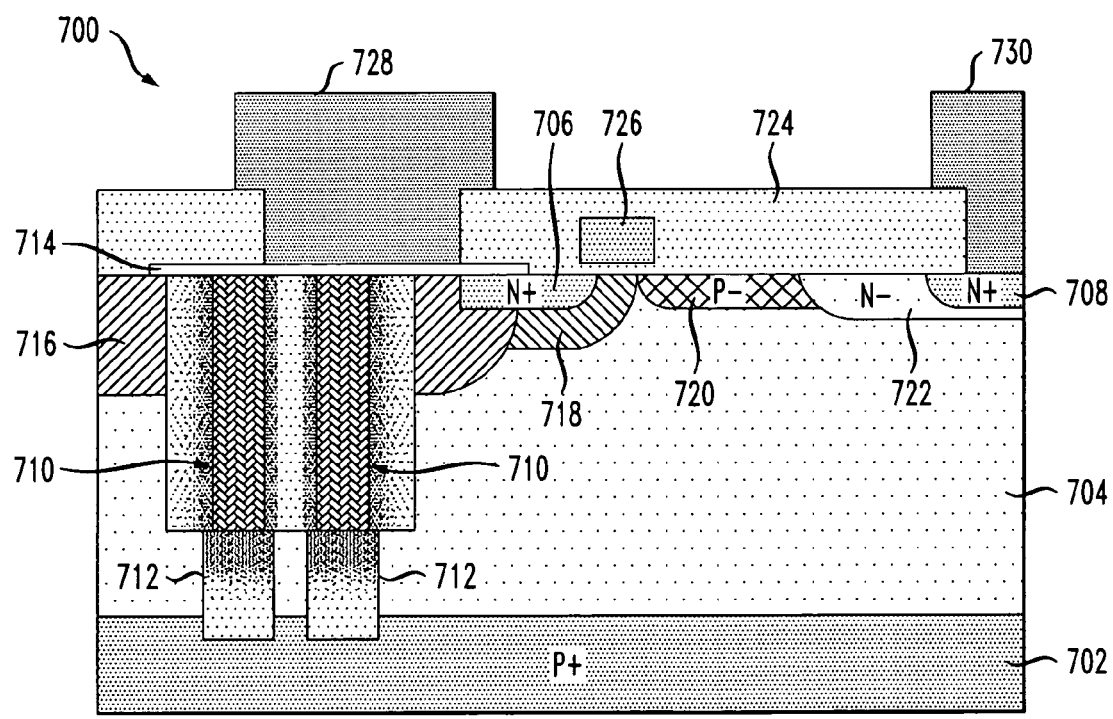
FIG. 7 is a cross-sectional view depicting at least a portion of an exemplary LDMOS device comprising the illustrative substrate contact formed by a semiconductor fabrication process of the type shown in FIGS. 2–6.

By way of example only, FIG. 7 illustrates a cross-sectional view of at least a portion of a semiconductor wafer 700 in which the techniques of the present invention are implemented. The wafer 700 includes an exemplary LDMOS device formed on the semiconductor wafer which comprises a p+ substrate 702 and an epitaxial layer 704. The exemplary LDMOS device includes a source region 706 and a drain region 708 formed in the epitaxial layer 704 of the wafer 700, such as by an implant or diffusion process. The source and drain regions are preferably doped, such as by an implant process, with an impurity (e.g., boron, phosphorus, etc.) of a known concentration level to selectively change the conductivity of the material as desired. Preferably, the source and drain regions 706, 708 have a conductivity type associated therewith which is opposite a conductivity type of the substrate 702, so that active regions can be formed in the device. In a preferred embodiment of the invention, the source and drain regions 706, 708 are of n-type conductivity.

It is to be appreciated that, in the case of forming a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region. In an LDMOS device, which is generally not symmetrical, such source and drain designations may not be arbitrarily assigned.

A low-resistance (e.g., less than about 1 ohm per square) electrical path between the source region 706 and the substrate 702 is provided by forming one or more improved substrate contacts 710 partially into the epitaxial layer 704 of the wafer 700, such as in the manner previously described in connection with FIGS. 2–6. The substrate contacts 710 are preferably electrically connected to the source region 706 by forming a conductive layer 714 on an upper surface of the epitaxial layer 704. The conductive layer 714 preferably comprises a silicide layer, such as titanium silicide, deposited by a sputter deposition process, although alternative conductive materials and/or deposition methodologies may be similarly employed, as will be known by those skilled in the art.

The exemplary LDMOS device may include a body region 716 formed in the epitaxial layer 704, such as by a conventional implant and diffusion process. The body region 716 is preferably formed adjacent to the source region 706 and extends laterally in a direction opposite the drain region 708. The body region 716 is preferably doped, such as by a conventional implant step, with an impurity of a known concentration level to selectively change the conductivity of the material as desired. Preferably, the body region 716 has a conductivity type associated therewith which is opposite a conductivity type of the source region 706. In a preferred embodiment of the invention, the body region 716 is of p-type conductivity, and is therefore referred to as a p-body.

A channel region 718 and a drift region, which may comprise a first lightly-doped drain (LDD) region 720 and a second LDD region 722, is formed proximate an upper surface of the exemplary LDMOS device, just beneath an interface between the silicon epitaxial layer 704 and an insulating layer 724, which in a preferred embodiment is formed of an oxide (e.g., silicon dioxide ($SiO_2$), etc.). This interface may thus be referred to as a silicon/oxide interface. The channel region 718 is formed at least partially below and adjacent to the source region 706, while the drift region extends laterally between the channel region 718 and the drain region 708 in the LDMOS device. The channel region 718 may be formed of a material having the same conductivity type as the substrate, preferably p-type in the exemplary device, and may therefore be referred to as a p-channel.

The exemplary LDMOS device further includes a gate 726 formed above at least a portion of the channel region 718 and proximate the silicon/oxide interface of the wafer 700. The gate 726 may be formed of, for example, polysilicon material, although alternative suitable materials (e.g., metal, etc.) may be similarly employed.

A source contact 728 and a drain contact 730 may be formed on an upper surface of the insulating layer 724, such as, for example, by forming openings in the insulating layer (e.g., by photolithographic patterning and etching) to expose the silicide layer 714 and drain region 708, respectively, and filling the openings with an electrically conductive material (e.g., aluminum, gold, etc.), as will be understood by those skilled in the art. The silicide layer 714 facilitates electrical connection with the source region 706, since it would otherwise be difficult to form a metal layer directly on the silicon source region. Connection to the source region 706 may also be made through a bottom surface of the substrate, since the substrate contacts 710 provide a substantially low-resistance electrical path between the source region 706 and the substrate 702, as previously explained. A gate contact (not shown) may also be formed on the upper surface of the insulating layer 724, or in an alternative location, for providing an electrical connection to the gate 726.

It is to be appreciated that although the exemplary substrate contact shown in the accompanying figures includes two trenches, the number and/or geometrical dimensions and shapes of the trenches are not limited in any way to the precise embodiment shown. Rather, the present invention contemplates that any number, shape and/or size of the trenches may be used to form the substrate contact. For instance, the substrate contact may comprise a single trench, or more than two trenches. Moreover, although all of the sidewalls and bottom wall of the trenches are preferably heavily doped, this is not a requirement of the invention. For example, only one side wall may be doped, so as to provide a sufficient distribution of impurity between the substrate and upper surface of the wafer.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method of forming a semiconductor structure in a semiconductor wafer, the method comprising the steps of:

forming an epitaxial layer on a least a portion of a semiconductor substrate of a first conductivity type;

forming at least one trench in an upper surface of the semiconductor wafer and partially into the epitaxial layer;

forming at least one diffusion region between a bottom wall of the at least one trench and the substrate, the at least one diffusion region providing an electrical path between the bottom wall of the at least one trench and the substrate;

doping at least one or more sidewalls of the at least one trench with a first impurity so as to form an electrical path between an upper surface of the epitaxial layer and the at least one diffusion region; and substantially filling the at least one trench with a filler material;

wherein the step of doping at least one or more sidewalls of the at least one trench is performed after the step of forming the at least one diffusion region.

2. The method of claim 1, wherein the step of forming the at least one diffusion region comprises the steps of:

implanting the bottom wall of the at least one trench with a second impurity of a known concentration level; and driving in the second impurity so as to substantially distribute the second impurity between the bottom wall of the at least one trench and the substrate.

3. The method of claim 1, further comprising the steps of:

polishing the upper surface of the epitaxial layer so that the upper surface of the epitaxial layer is substantially planar; and forming an insulating layer on at least a portion of the upper surface of the epitaxial layer.

4. The method of claim 3, wherein the upper surface of the insulating layer is at least a portion of the upper surface of the semiconductor wafer.

5. The method of claim 1, wherein the step of forming the at least one trench comprises:
   forming an insulating layer on at least a portion of the upper surface of the epitaxial layer;
   forming at least one opening in the insulating layer corresponding to the at least one trench; and
   etching partially into the epitaxial layer.

6. The method of claim 1, wherein the at least one trench comprises a v-groove.

7. The method of claim 1, wherein the step of doping at least one or more sidewalls of the at least one trench with an impurity comprises:
   cleaning the sidewalls of the at least one trench to substantially remove any organic material in the at least one trench;
   predepositing the first impurity on at least one or more sidewalls of the at least one trench; and
   driving in the first impurity.

8. The method of claim 7, wherein the first impurity comprises boron.

9. The method of claim 7, wherein the step of driving in the first impurity comprises heating the semiconductor wafer for a designated period of time.

10. The method of claim 9, wherein the step of heating the semiconductor wafer comprises heating the semiconductor wafer at a temperature in a range of about 900 degrees Celsius to about 1200 degrees Celsius for a duration of about one hour.

11. The method of claim 7, wherein the step of predepositing the first impurity on at least one or more sidewalls of the at least one trench comprises growing an impurity-rich oxide on at least one or more sidewalls of the at least one trench.

12. The method of claim 1, wherein the step of substantially filling the at least one trench comprises depositing a semiconductor material in the at least one trench so as to substantially fill the trench.

13. The method of claim 1, wherein the filler material comprises polysilicon material.

14. The method of claim 1, further comprising the step of forming at least one insulating layer on at least a portion of the upper surface of the epitaxial layer.

15. The method of claim 1, further comprising the step of:
   forming an active device in the epitaxial layer proximate the upper surface of the epitaxial layer, the active device being in electrical connection with a first end of the at least one trench, a second end of the at least one trench being electrically connected to the substrate.

16. The method of claim 15, wherein the active device comprises a metal-oxide-semiconductor device.

17. The method of claim 1, further comprising the steps of:
   forming an insulating layer on at least a portion of the upper surface of the epitaxial layer;
   forming a gate on at least a portion of the insulating layer;
   forming source and drain regions of a second conductivity type in the epitaxial layer proximate the upper surface of the epitaxial layer, the source and drain regions being spaced laterally from one another, the gate being formed at least partially between the source and drain regions, the source region being electrically connected to a first end of the at least one trench and a second end of the at least one trench being electrically connected to the substrate.

18. The method of claim 1, wherein the step of forming at least one trench comprises forming a plurality of trenches in the upper surface of the semiconductor wafer and partially into the epitaxial layer, at least two of the trenches being spaced about five microns apart relative to one another.

19. The method of claim 1, wherein the at least one trench is formed less than about 1.2 microns in width.

* * * * *